United States Patent
Randazzo

Patent Number: 6,093,585
Date of Patent: Jul. 25, 2000

[54] HIGH VOLTAGE TOLERANT THIN FILM TRANSISTOR

[75] Inventor: Todd A. Randazzo, Colorado Springs, Colo.

[73] Assignee: LSI Logic Corporation, Milpitas, Calif.

[21] Appl. No.: 09/075,029

[22] Filed: May 8, 1998

[51] Int. Cl.$^7$ .............................. H01L 21/00; H01L 21/20
[52] U.S. Cl. ........................ 438/151; 438/238; 438/396
[58] Field of Search .................................. 438/151, 152, 438/238, 389, 396, 559

[56] References Cited

U.S. PATENT DOCUMENTS

| | | | |
|---|---|---|---|
| 4,181,537 | 1/1980 | Ichinohe | 148/1.5 |
| 4,240,092 | 12/1980 | Kuo | 357/41 |
| 4,350,536 | 9/1982 | Nakano et al. | 148/1.5 |
| 4,391,032 | 7/1983 | Schulte | 29/571 |
| 4,411,058 | 10/1983 | Chen | 29/571 |
| 4,442,591 | 4/1984 | Haken | 29/571 |
| 4,466,177 | 8/1984 | Chao | 29/571 |
| 4,472,871 | 9/1984 | Green et al. | 29/571 |
| 4,527,180 | 7/1985 | Oto | 357/23.6 |
| 4,558,508 | 12/1985 | Kinney et al. | 29/571 |
| 4,590,663 | 5/1986 | Haken | 29/571 |
| 4,613,883 | 9/1986 | Tihanyi | 357/23.4 |
| 4,613,885 | 9/1986 | Haken | 357/42 |
| 4,622,570 | 11/1986 | Taguchi | 357/23.6 |
| 4,626,450 | 12/1986 | Tani et al. | 427/93 |
| 4,639,274 | 1/1987 | Krishna | 148/1.5 |
| 4,677,739 | 7/1987 | Doering et al. | 29/576 B |
| 4,697,332 | 10/1987 | Joy et al. | 437/29 |
| 4,717,683 | 1/1988 | Parrillo et al. | 437/34 |
| 4,735,915 | 4/1988 | Kita et al. | 437/52 |
| 4,819,052 | 4/1989 | Hutter | 357/49 |
| 4,826,779 | 5/1989 | Wright et al. | 437/20 |
| 4,866,002 | 9/1989 | Shizukuishi et al. | 437/34 |
| 4,889,825 | 12/1989 | Parrillo | 437/34 |
| 4,896,243 | 1/1990 | Chatterjee et al. | 362/91 |
| 4,929,565 | 5/1990 | Parrillo | 437/34 |
| 5,014,105 | 5/1991 | Hata et al. | 357/42 |
| 5,024,960 | 6/1991 | Haken | 437/34 |
| 5,037,772 | 8/1991 | McDonald | 437/52 |
| 5,047,358 | 9/1991 | Kosiak et al. | 437/34 |
| 5,097,310 | 3/1992 | Eimori et al. | 257/371 |
| 5,145,799 | 9/1992 | Rodder | 437/47 |
| 5,182,225 | 1/1993 | Matthews | 437/58 |
| 5,252,510 | 10/1993 | Lee et al. | 437/57 |
| 5,254,487 | 10/1993 | Tamagawa | 437/34 |
| 5,285,995 | 2/1994 | Malhi | 257/343 |
| 5,382,820 | 1/1995 | Yang et al. | 257/371 |
| 5,413,944 | 5/1995 | Lee | 437/34 |
| 5,416,038 | 5/1995 | Hsue et al. | 437/57 |
| 5,432,114 | 7/1995 | O | 437/56 |
| 5,438,005 | 8/1995 | Jang | 437/34 |
| 5,449,637 | 9/1995 | Saito et al. | 437/57 |
| 5,468,666 | 11/1995 | Chapman | 437/44 |
| 5,472,887 | 12/1995 | Hutter et al. | 437/34 |
| 5,473,183 | 12/1995 | Yonemoto | 257/371 |
| 5,495,122 | 2/1996 | Tada | 257/392 |
| 5,497,021 | 3/1996 | Tada | 257/369 |

(List continued on next page.)

FOREIGN PATENT DOCUMENTS

| | | | |
|---|---|---|---|
| 4218972 | 8/1992 | Japan | 257/371 |
| 621374A | 1/1994 | Japan | 257/371 |

*Primary Examiner*—David Nelms
*Assistant Examiner*—Michael S. Lebentritt

[57] ABSTRACT

High voltage tolerant thin film transistors (TFTs) may be formed during a dual work function polysilicon process used to fabricate poly—poly capacitors with substantially no additional process complexity. Polysilicon lower plate material is patterned in those areas targeted for TFT formation into source, drain, and channel regions. In one embodiment, TFT source and drain regions are doped to the same conductivity as capacitor lower plate regions while TFT channel regions are not doped. In another embodiment, TFT channel regions are lightly doped with positively charged ions. Capacitor dielectric material is used to form TFT gate structures. Capacitor top plate silicon provides TFT gate connection surfaces.

38 Claims, 10 Drawing Sheets

U.S. PATENT DOCUMENTS

| | | | |
|---|---|---|---|
| 5,506,438 | 4/1996 | Hsue et al. | 257/376 |
| 5,517,046 | 5/1996 | Hsing et al. | 257/336 |
| 5,527,722 | 6/1996 | Hutter et al. | 437/34 |
| 5,536,672 | 7/1996 | Miller et al. | 437/52 |
| 5,541,123 | 7/1996 | Williams et al. | 437/31 |
| 5,541,125 | 7/1996 | Williams et al. | 437/34 |
| 5,541,435 | 7/1996 | Beasom | 257/409 |
| 5,545,577 | 8/1996 | Tada | 437/41 |
| 5,547,880 | 8/1996 | Williams et al. | 437/15 |
| 5,548,147 | 8/1996 | Mei | 257/333 |
| 5,559,044 | 9/1996 | Williams et al. | 437/34 |
| 5,573,963 | 11/1996 | Sung | 437/34 |
| 5,576,570 | 11/1996 | Ohsawa et al. | 257/369 |
| 5,578,855 | 11/1996 | Gaffur et al. | 257/371 |
| 5,583,061 | 12/1996 | Williams et al. | 437/34 |
| 5,585,660 | 12/1996 | Mei | 257/389 |
| 5,618,743 | 4/1997 | Williams et al. | 438/276 |
| 5,622,885 | 4/1997 | Merrill et al. | 438/220 |
| 5,650,341 | 7/1997 | Yang et al. | 437/34 |
| 5,663,086 | 9/1997 | Restoker et al. | 438/210 |
| 5,739,572 | 4/1998 | Noguchi | 257/371 |
| 5,759,887 | 6/1998 | Ito et al. | 437/238 |
| 5,780,351 | 7/1998 | Arita et al. | 438/396 |
| 5,804,488 | 9/1998 | Shih et al. | 438/396 |
| 5,858,852 | 1/1999 | Aiso et al. | 438/396 |
| 5,909,624 | 6/1999 | Yeager et al. | 438/396 |
| 5,923,970 | 7/1999 | Kirlin | 438/240 |
| 5,930,627 | 7/1999 | Zhou et al. | 438/257 |

HIGH VOLTAGE TOLERANT THIN FILM TRANSISTOR

BACKGROUND

The invention relates to high voltage tolerant thin film transistors. Table 1 provides a list of symbols used in this document and their meanings.

TABLE 1

Useful Definitions

| | |
|---|---|
| Å | Angstrom |
| cm | centimeter |
| $I_D$ | drain current |
| keV | kilo-electron volts |
| MeV | mega-electron volts |
| v | volt |
| $V_D$ | drain voltage |
| $V_{th}$ | transistor threshold voltage |
| $\Omega/\square$ | ohms per square |
| µm | micrometer |

Semiconductors fabricated using complementary metal oxide semiconductor (CMOS) technology use polysilicon (Si, also referred to as polycrystaline or amorphous silicon) to form transistor gate structures. Early CMOS processes used polysilicon heavily doped with n-type impurities (n+) for both n-channel (NMOS) and p-channel (PMOS) transistor gates. In these technologies, PMOS transistor channel regions were counter doped with p-type impurities to achieve desired PMOS device threshold voltages.

Figure 1A:
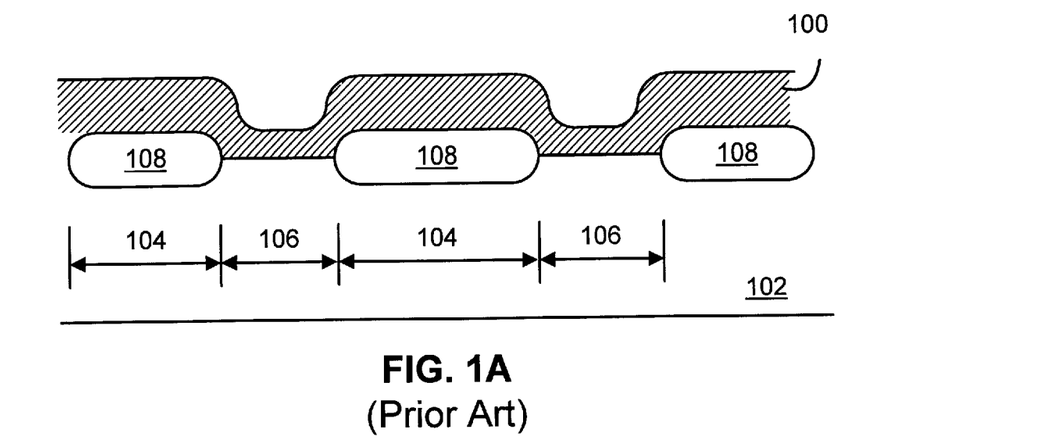
FIGS. 1A and 1B show a layer of polysilicon formed over a substrate having field and active regions.
Figure 1B:
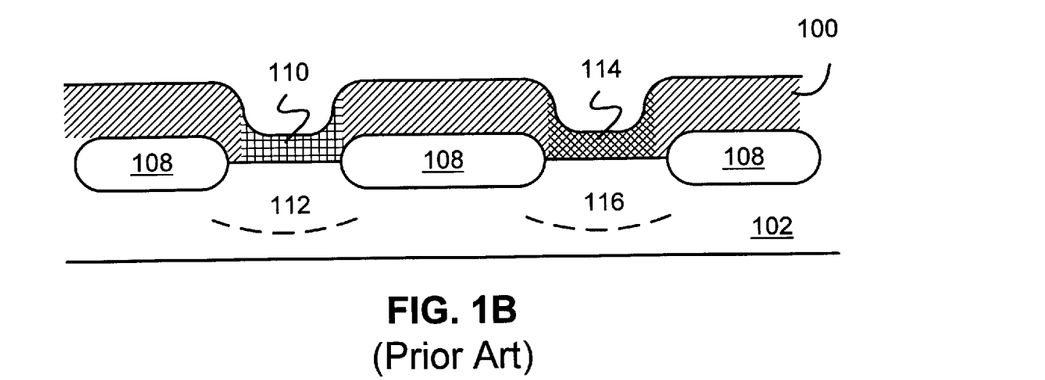

Many recent CMOS technologies use what is referred to as a dual work function polysilicon (poly) process. As shown in FIG. 1A, a dual work function poly process begins by forming a layer of undoped polysilicon 100 over a substrate 102 that has previously had field regions 104 and active regions 106 defined by field oxide 108. Once formed, see FIG. 1B, polysilicon 100 is patterned and doped to provide n+ regions 110 (for NMOS device 112 gates) and p+ regions 114 (for PMOS device 116 gates). The added complexity of the dual work function process (over one-type polysilicon procedures) is offset by the ability to independently optimize both NMOS 112 and PMOS 116 devices.

Figure 2A:
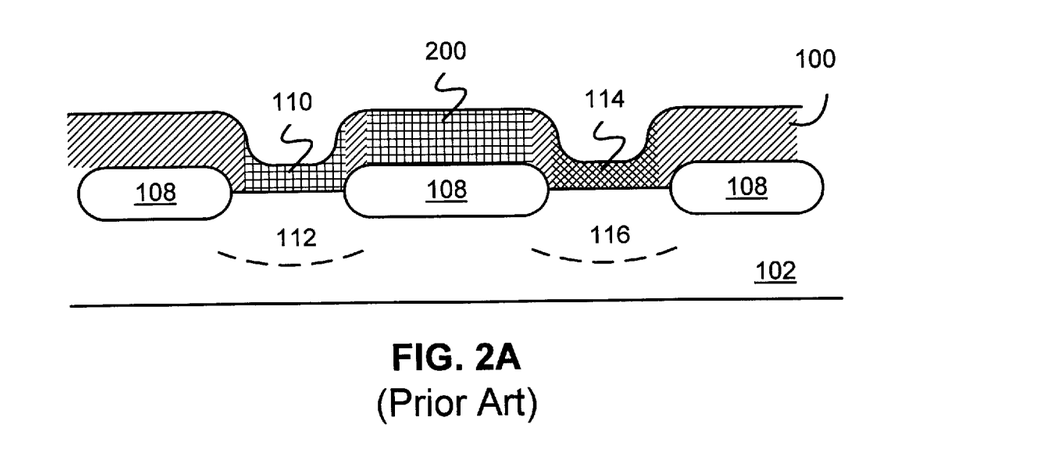
FIGS. 2A through 2C show a poly—poly capacitor formed during a dual work function polysilicon process.

Referring to FIG. 2A, at the time that polysilicon region 110 is doped to form a NMOS transistor gate, a region 200 is also n+ doped. Region 200 will become the lower plate of a polysilicon-polysilicon (poly—poly) capacitor.

Figure 2B:
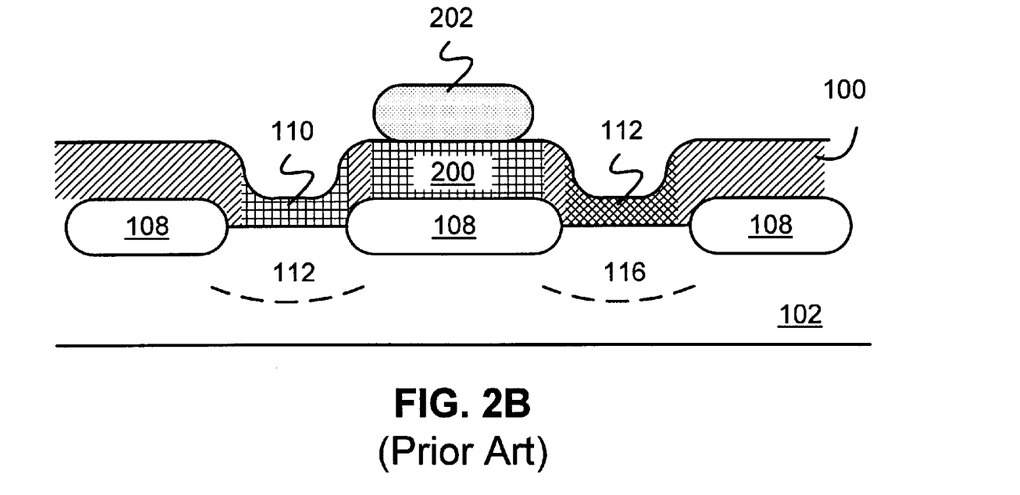
Figure 2C:
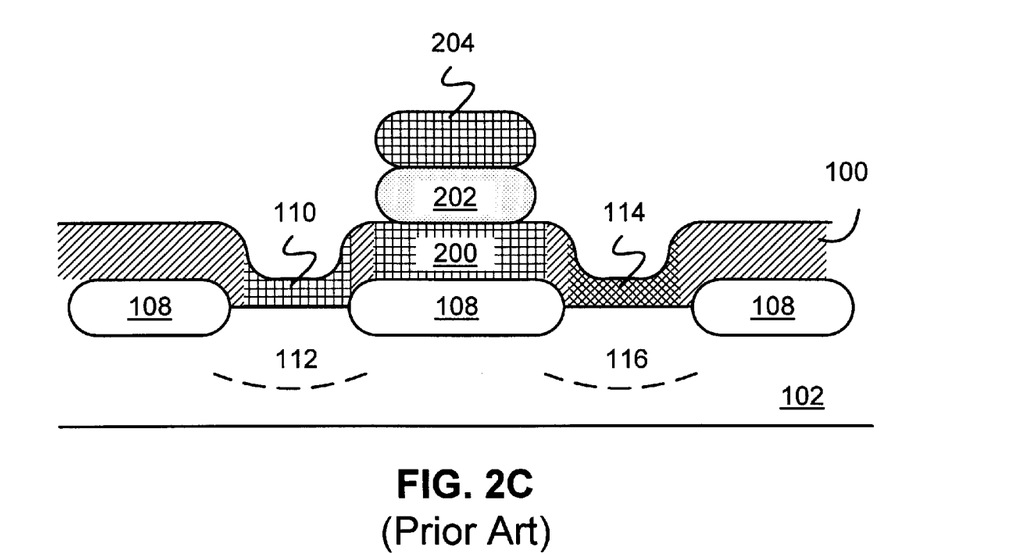

Referring now to FIGS. 2B and 2C, after doping polysilicon 100, a layer of dielectric material 202 is laid down over region 200. Materials commonly used for dielectric material 202 include silicon dioxide ($SiO_2$), oxide-nitride-oxide or ONO ($SiO_2$—$Si_3N_4$—$SiO_2$), tetraethyl orthosilicate (TEOS), and silicon nitride ($Si_3N_4$). A second n+ doped layer of polysilicon 204 is formed over dielectric 202 to provide the capacitor's top plate. A poly—poly capacitor (comprising lower plate n+ polysilicon 200, dielectric 202, and top plate n+ polysilicon 204) may be used for pole-splitting, amplifier compensation, charge redistribution, or as an element in a filter or attenuator.

Advances in CMOS fabrication techniques, especially those including a dual work function poly process, allow the design and manufacture of integrated circuits having very high device packing densities. One consequence of increasing transistor densities is that device operating voltages are generally getting lower. Whereas older transistor-transistor logic (TTL) circuits were designed to operate at approximately 5v, newer circuits such as memory devices and central processing units are being designed to operate at 3.3v, 2.5v, and 1.8v.

These new low voltage devices are more susceptible to damage from high voltage signals than prior devices. For example, an integrated circuit implemented using 1.8v technology can be damaged when exposed to a high voltage signal, e.g., a signal of approximately 6v and above. It would be beneficial to integrate both low voltage and high voltage devices into a single integrated circuit on a single substrate. The combined integration of low and high voltage devices would make possible the design and manufacture of complete functional circuits; circuits having both logic and direct input-output control capability.

SUMMARY

In one aspect, the invention provides a high gate voltage tolerant thin film transistor at substantially no added process complexity over that incurred when implementing polysilicon capacitors. In one method, after a first layer of silicon (having a first conductivity type, e.g., neutral) is formed over a substrate surface it is patterned into a plurality of capacitor bottom plate regions, and thin film transistor source, drain, and channel regions. The capacitor bottom plate regions, and the thin film transistor source and drain regions are doped to a second conductivity type (e.g., n+). Thin film channel regions are not doped. Next, a layer of dielectric material is formed over the capacitor bottom plate regions and the thin film transistor channel region. A second layer of silicon (having a third conductivity type, e.g., n+) is then formed over the capacitor bottom plate regions (and the dielectric formed thereon) and the thin film transistor channel region (and the dielectric formed thereon). Interconnects may be formed in a standard manner to provide connective paths to and between the capacitors and thin film transistors.

In another aspect, the invention provides a thin film transistor that is both high gate voltage and high drain voltage tolerant. In this second embodiment, the thin film transistor's polysilicon channel material is lightly doped with a positively charged impurity.

Thin film transistors in accordance with the invention may be incorporated in a semiconductor circuit having low voltage transistors formed in a semiconductor bulk material below the silicon film. The low voltage transistors may be formed in any convenient manner. For example, high energy implant twin-well technology.

DETAILED DESCRIPTION

High voltage tolerant thin film transistors (TFTs) can be fabricated, with substantially no added process complexity, by exploiting the use of dual work function polysilicon during the formation of poly—poly capacitors. The following embodiments of this inventive concept are illustrative only and are not to be considered limiting in any respect.

Figure 3:
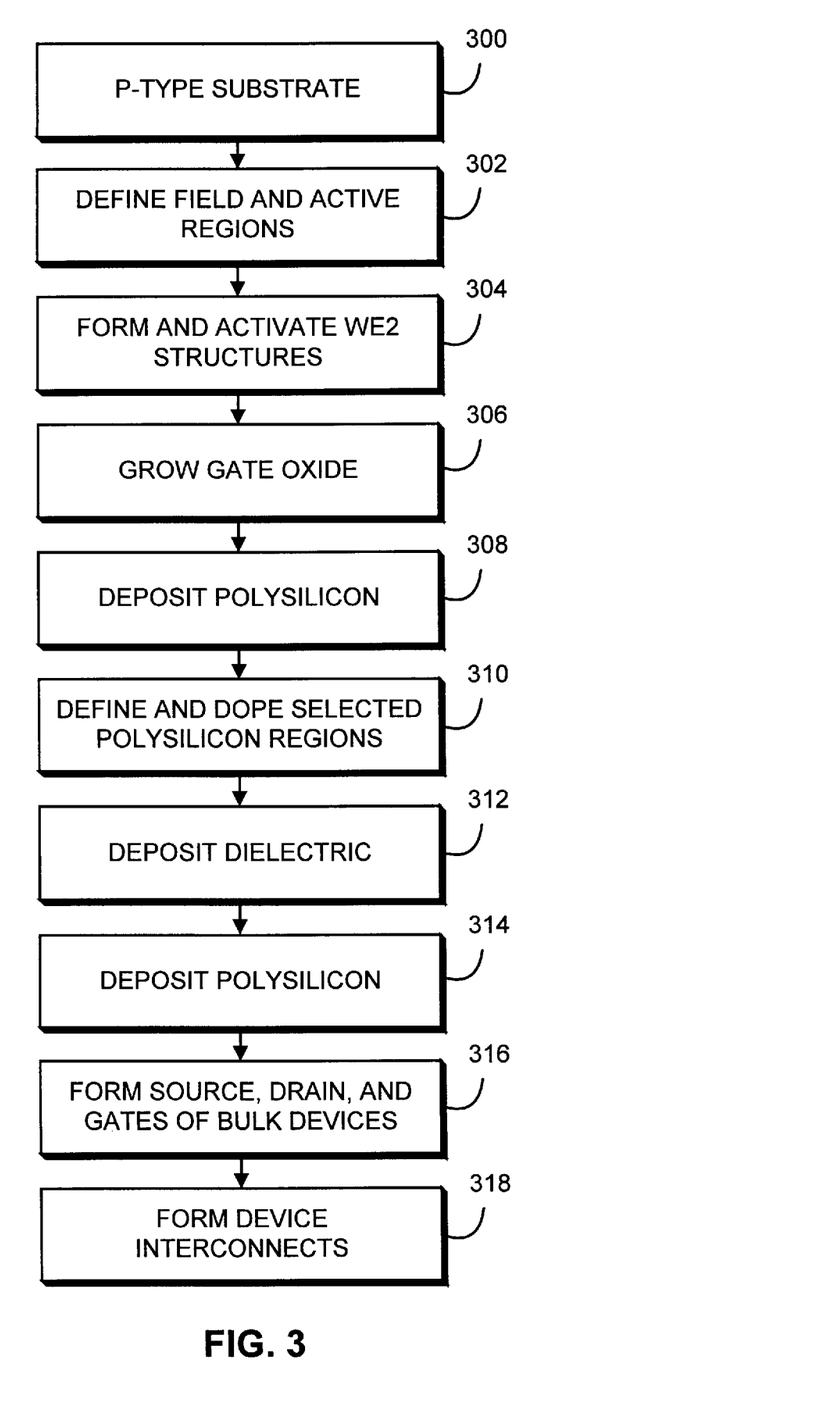
FIG. 3 shows a high voltage tolerant thin film transistor fabrication process flow.

One process flow for the fabrication of a high gate voltage tolerant TFT, formed in a p-type substrate using high energy implant twin-well technology, is shown in FIG. 3. Fabrication begins with a p-type substrate having an ionic concentration between approximately $5e^{14}$ atoms/cm$^3$ and $5e^{15}$ Boron atoms/cm$^3$ (step 300). Field and active regions are defined using any suitable isolation technology in step 302. Suitable isolation technologies include local oxidation of silicon (LOCOS) and its variants such as semirecessed, sidewall-masked isolation (SWAMI), self-aligned planar-oxidation technology (SPOT), sealed-interface local oxidation (SILO), and fully recessed oxide (FUROX) as well as non-LOCOS techniques such as trench technology.

Figure 4A:
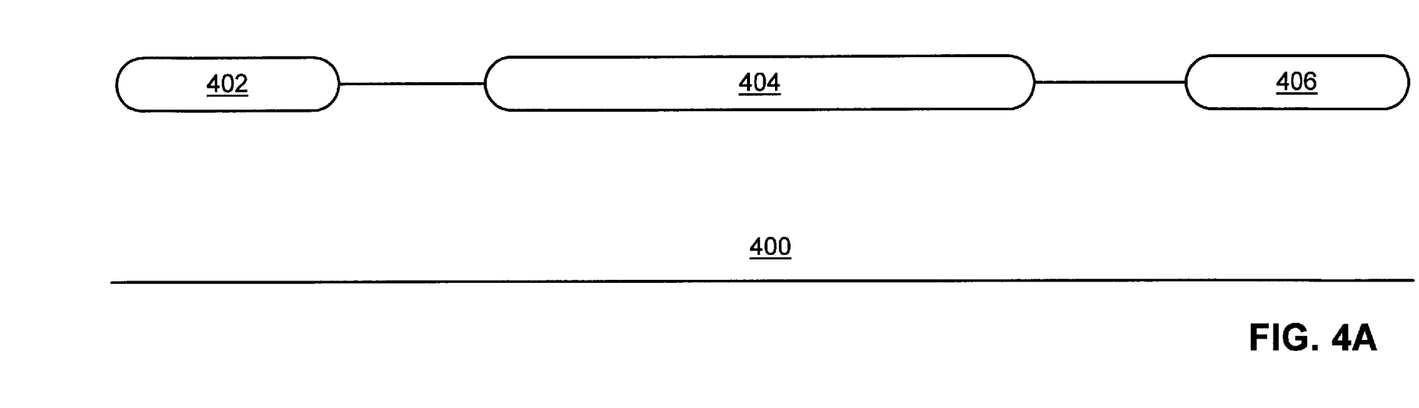
FIGS. 4A through 4G show semiconductor substrate cross-sections corresponding to some of the process step of FIG. 3.

FIGS. 4A through 4G illustrate substrate cross-sections corresponding to some of the process flow steps of FIG. 3 when a general LOCOS isolation technique is used in step 302. Referring now to FIG. 4A, those regions of substrate 400 beneath field oxide 402, 404, and 406 are "field" regions. Those regions of substrate 400 between the field oxide are "active" regions. Field oxide 402, 404, and 406 is comprised of silicon dioxide (SiO$_2$) between approximately 2000 Å and 5000 Å thick.

Figure 4B:
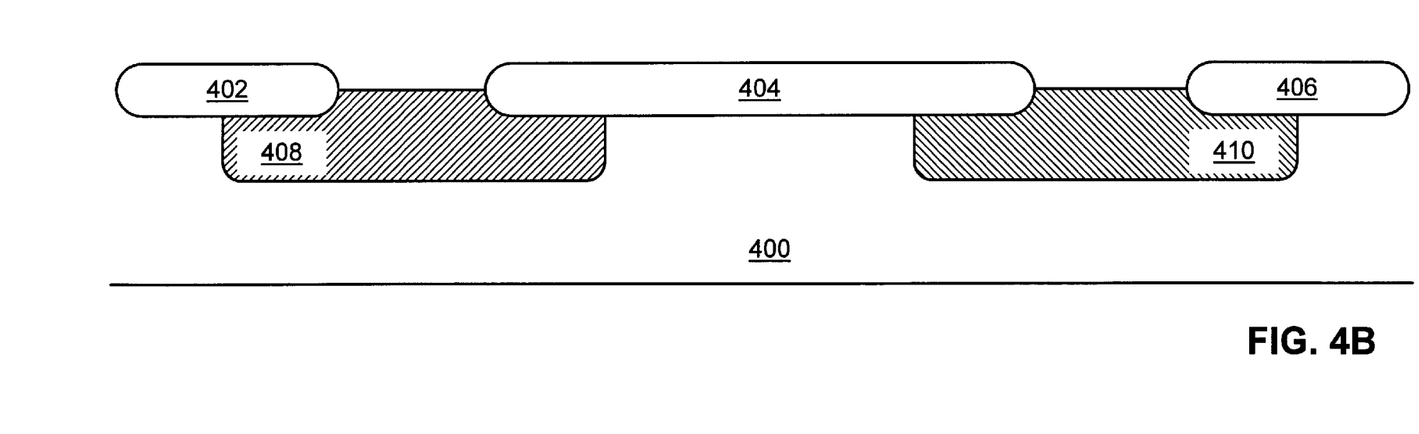

Following isolation, retrograde p-well and n-well structures are formed via high energy implantation (step 304). Referring to FIG. 4B, a n-channel (NMOS) transistor can be formed in p-well 408, and a p-channel (PMOS) transistor can be formed in n-well 410. P-well 408 and n-well 410 may be formed using more than one implant. For example, a n-well having approximately $2e^{11}$ ions/cm$^2$ to $2e^{13}$ ions/cm$^2$ can be formed by a first implant of arsenic (As) and/or phosphorous (P) at 50 keV to 200 keV (preferably 100 keV), followed by a second implant of As and/or P at 250 keV to 700 keV (preferably 400 keV), followed by a third implant of As and/or P at 500 keV to 2 MeV (preferably 800 keV). (A layer of photoresist, not shown in FIG. 4B, may be used to shield areas of substrate 400 where no implantation is desired.)

Once formed, a relatively short duration and low temperature anneal operation is used to activate p-well 408 and n-well 410 (step 304). A typical activation anneal uses an 850 C to 1000 C bake for 15 to 60 minutes. The anneal's relatively low temperature and short time period limits the lateral diffusion of the implanted ions, resulting in relatively sharp well edges and well ionic concentrations of approximately $1e^{16}$ ions/cm$^3$ to $5e^{17}$ ions/cm$^3$.

Figure 4C:
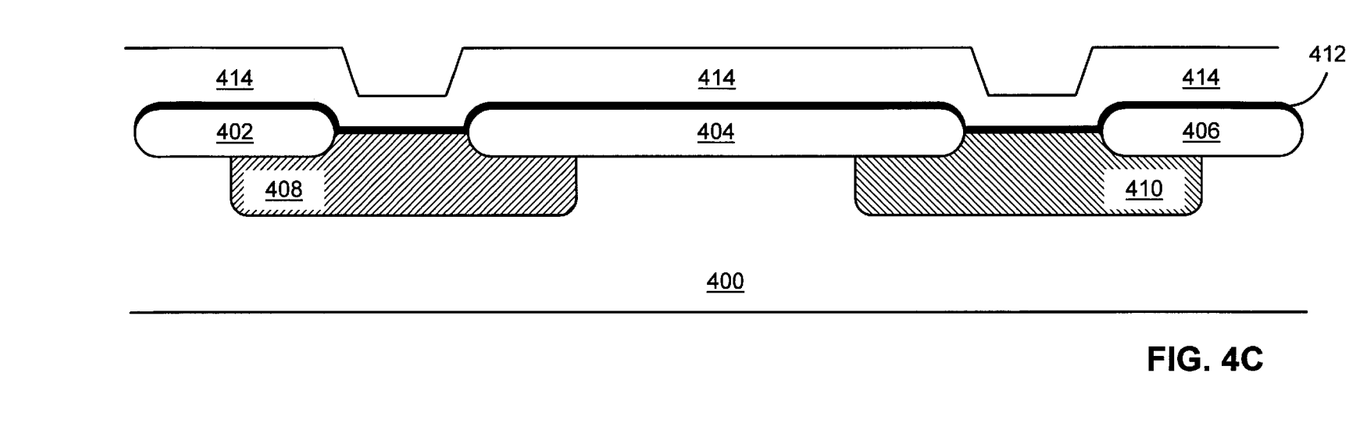

After well implants have been activated, a thin layer of SiO$_2$ (gate oxide) is grown onto the circuit's surface (step 306), followed by a deposition of undoped (dual work function) polysilicon (step 308). Referring to FIG. 4C, gate oxide 412 is generally between 30 Å and 200 Å, and preferably 70 521 thick. Polysilicon 414 is deposited at a temperature of between approximately 460 C and 625 C to a thickness of between approximately 1200 Å and 4000 Å.

Figure 4D:
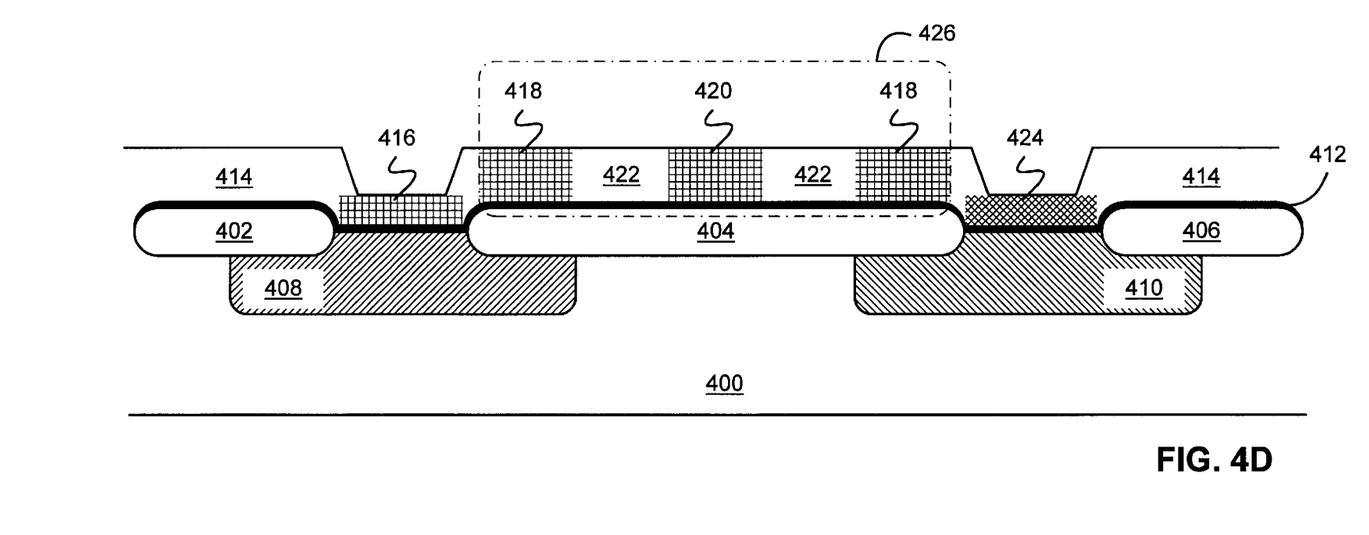
Figure 5:
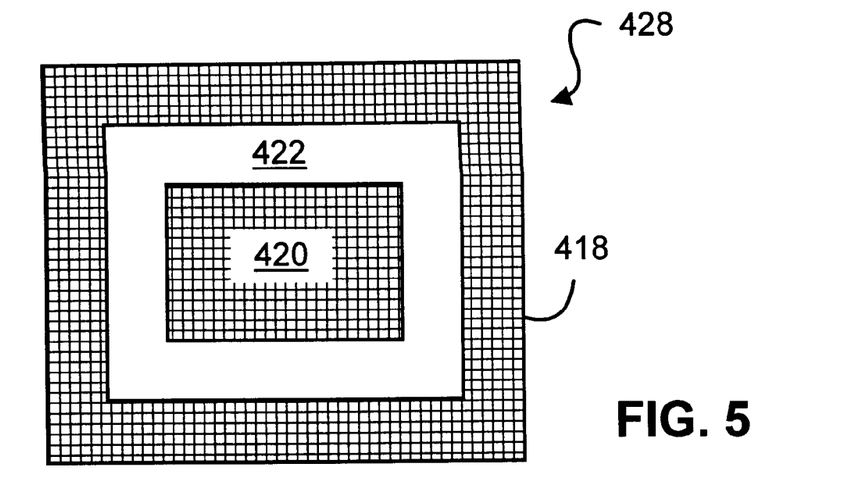
FIG. 5 shows a top view for a portion of FIG. 4D.

Next, polysilicon 414 is patterned and doped to provide three types of regions: n+; p+; and neutral/undoped (step 310). Referring to FIG. 4D, those areas targeted for lower plate capacitor formation (not shown in FIG. 4D, see "Background" discussion), those above NMOS transistor active regions 416, and those targeted for TFT source 418 and drain 420 formation are doped n+. Those areas that will be used to form the TFT's channel region 422 are left neutral/undoped. And those areas above PMOS transistor active regions 424 are doped p+. TFT source 418 and drain 420 regions and NMOS gate regions 416 are doped to provide a sheet resistance of between approximately 100 Ω/□ and 400 Ω/□ (e.g., $10^{19}$ ions/cm$^3$ to $10^{20}$ ions/cm$^3$). FIG. 5 shows a top view of TFT formation area 426. As described, high voltage tolerant TFT source, drain, and channel doping patterns may be obtained without any additional processing steps over that required to fabricate MOS capacitor lower plates.

Figure 4E:
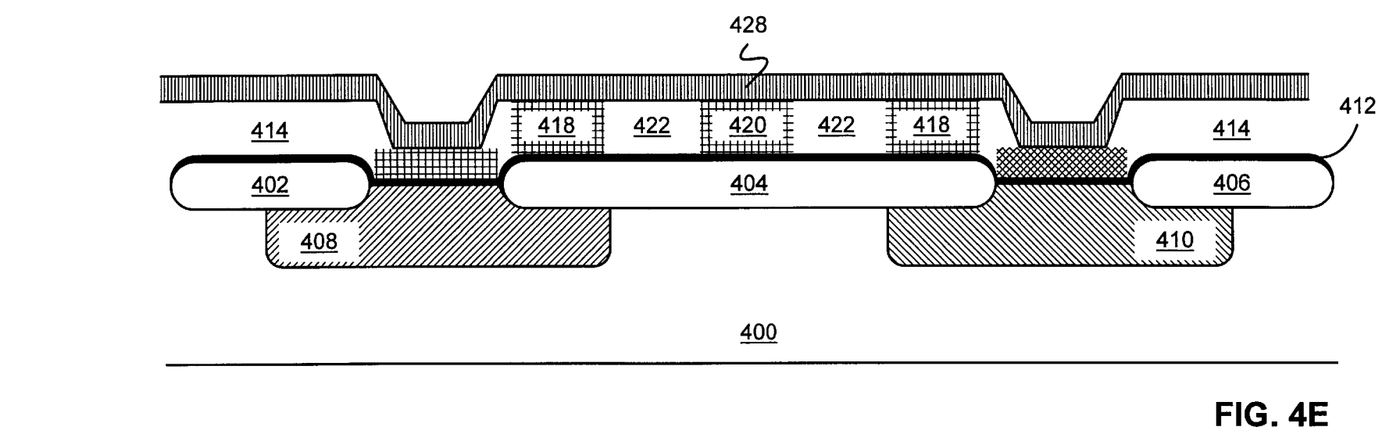

During step 312, capacitor dielectric material is deposited. Referring to FIG. 4E, dielectric 428 typically provides between approximately 0.4 pf/$\mu^2$ and 3 pf/$\mu^2$ and is between approximately 100 Å and 500 Å thick. Dielectric 428 may be any of a variety of materials including SiO$_2$, oxide-nitride-oxide or ONO (SiO$_2$—Si$_3$N$_4$—SiO$_2$), tetraethyl orthosilicate (TEOS), and silicon nitride (Si$_3$N$_4$). Each of these materials has its own deposition requirements (e.g., temperature and time) which are known in the art. Because it is anticipated that significantly more poly—poly capacitors are being formed on substrate 400 than high voltage TFTs, deposition of dielectric 428 may be optimized for capacitor formation.

Figure 4F:
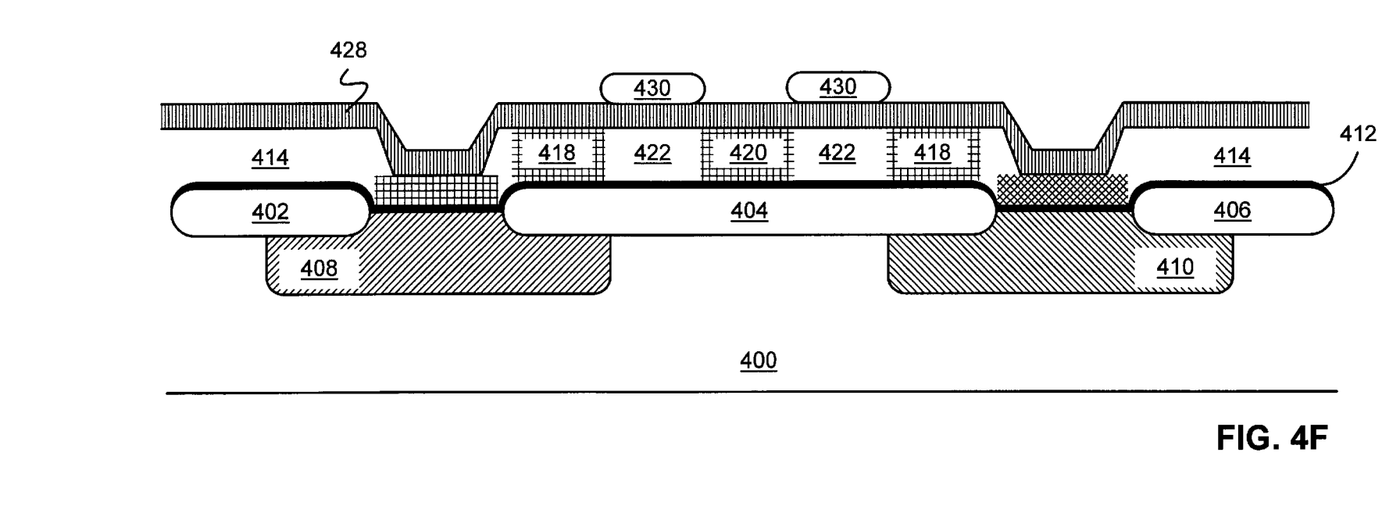
Figure 4G:
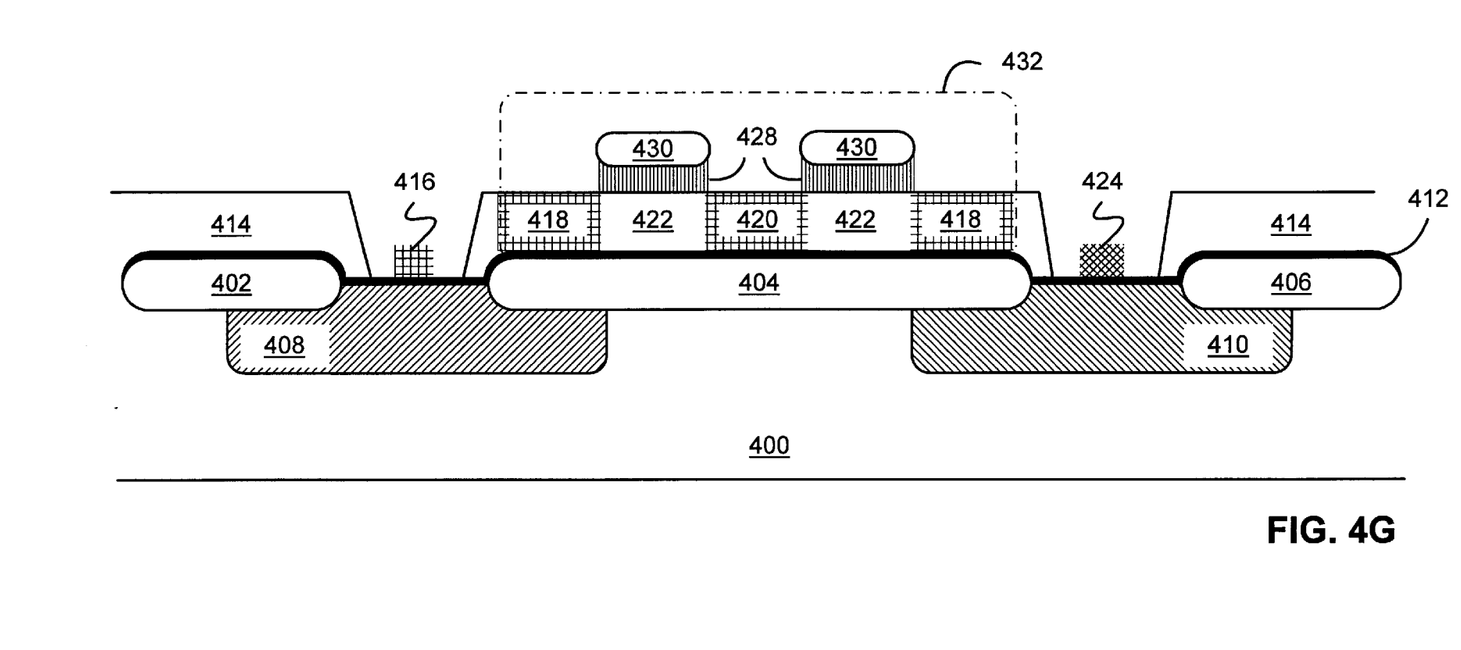
Figure 6:
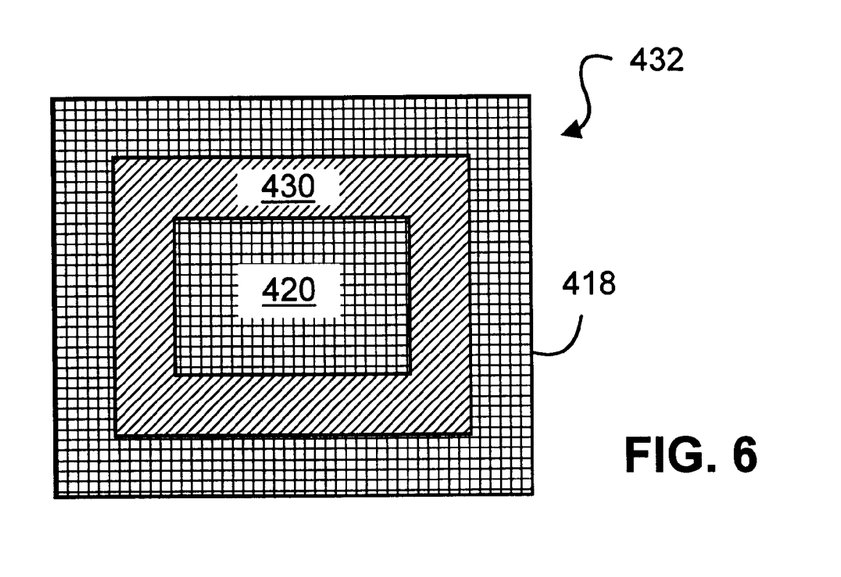
FIG. 6 shows a top view for a portion of FIG. 4G.

Referring to FIG. 4F, high voltage TFT gate structures 430 are formed at the same time, and in the same manner as capacitor top plates; through the deposition and patterning of heavily n doped (in situ) polysilicon at a temperature of between approximately 460 C and 625 C, and to a thickness of between approximately 500 Å and 4000 Å, preferably 1500 Å (step 314). TFT gate and capacitor top plate doping is generally sufficient to produce a polysilicon sheet resistance of between approximately 20 Ω/□ and 150 Ω/□. Following dielectric removal (e.g., via standard etching techniques), a structure similar to that shown in FIG. 4G is formed. FIG. 6 shows a top view of the high voltage TFT structure 432 shown in cross-section in FIG. 4G. As described, high voltage tolerant TFT gates are obtained without any additional processing steps over that required to fabricate MOS capacitor upper plates.

Source, drain, and gate structures for low voltage devices (e.g., NMOS and PMOS bulk transistors) are formed in a standard manner (step 316). It is during bulk transistor gate formation that the first polysilicon layer (formed during step 308) is typically patterned (e.g., etched). This patterning isolates a TFT from surrounding devices such as other TFTs, capacitors, and bulk devices.

As a final step, conductive paths are formed to allow use of the completed high voltage TFTs, low voltage NMOS and PMOS transistors, and capacitors (step 318). Materials suitable for forming device interconnections include, but are not limited to, aluminum (Al), molybdenum (Mo), tungsten (W), titanium nitride (TiN), and titanium-tungsten combinations (Ti:W).

Figure 7A:
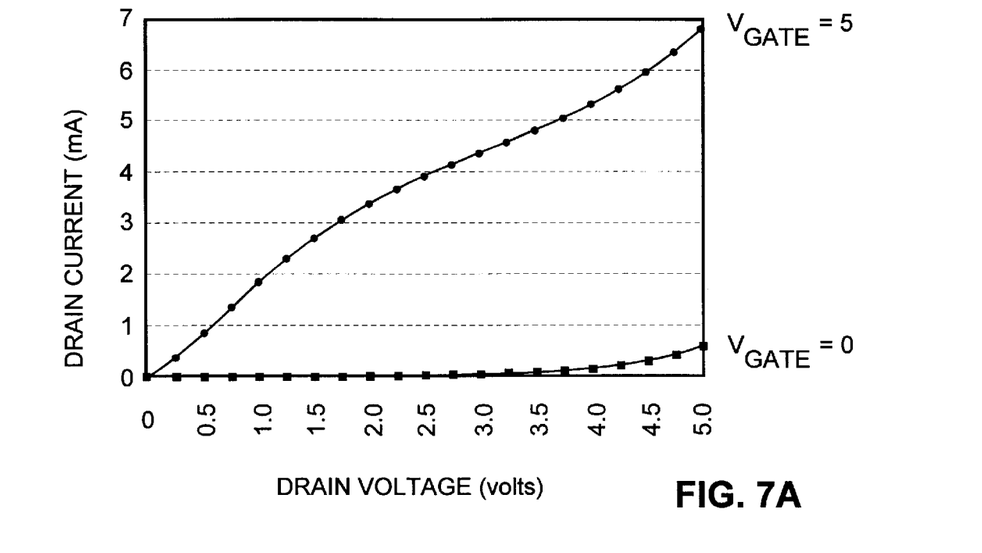
FIGS. 7A and 7B show test data for one illustrative high gate voltage tolerant thin film transistor.
Figure 7B:
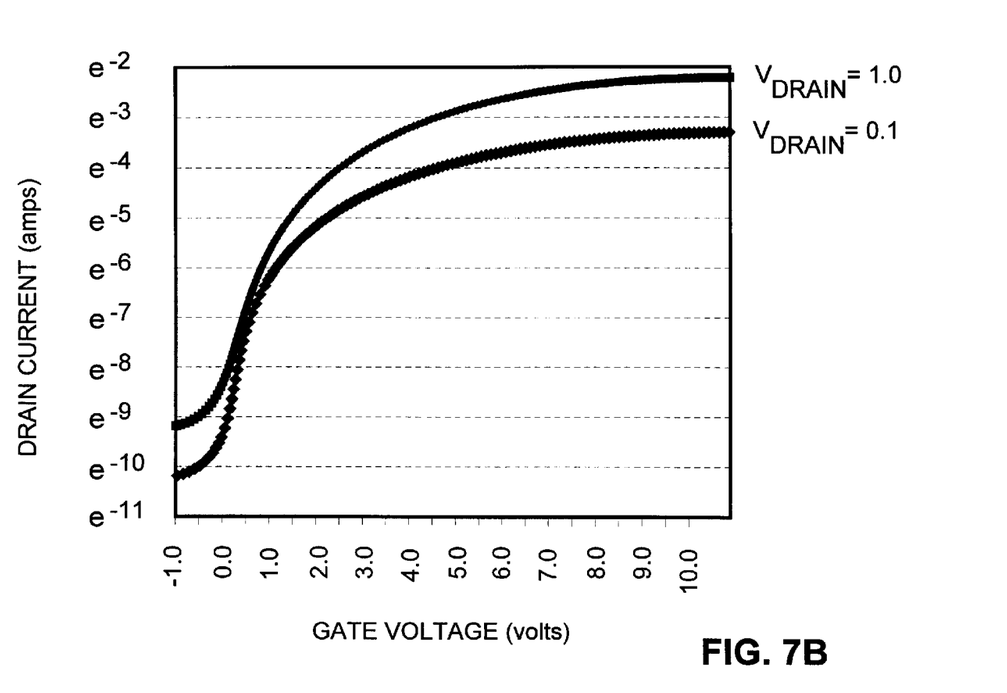

Test data for a high gate voltage tolerant TFT is shown in FIGS. 7A and 7B. The high voltage transistor's characteristics were as follows: $V_{th}$ of approximately 0.6 v; source and drain regions (corresponding to capacitor bottom plates) are n+ doped and 2500 Å thick; channel region is undoped and 2500 Å thick; capacitor dielectric is a 220 Å thick layer of TEOS; and gate structure (corresponding to capacitor top plates) is a 1500 Å thick in situ n+ doped layer having a length of approximately 3 $\mu$m (could be between approximately 0.6 $\mu$m to 5.0 $\mu$m), and a width of approximately 100 $\mu$m (could be any value greater than approximately 2 $\mu$m). Low voltage device (i.e., bulk PMOS and NMOS transistors) characteristics were as follows: $V_{th}$ of approximately 0.6v; gate breakdown voltage of approximately 7.5v;

drain breakdown voltage of approximately 6.0v; device operating voltage of approximately 3.3v; device-to-device spacing of approximately 0.6 μm; and a gate oxide thickness of approximately 70 Å. As shown in FIGS. 7A and 7B, no aberrant behavior (breakdown, snap-back, or punch-through) was detected even at drain voltages significantly above 6.0v, the specified low voltage device drain breakdown voltage.

Figure 8A:
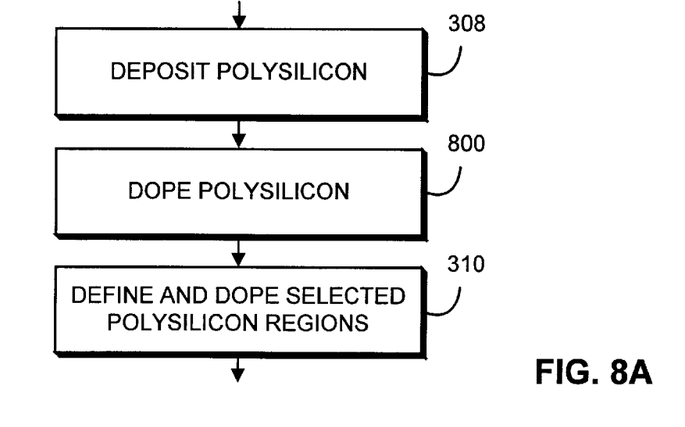
FIGS. 8A and 8B show certain aspects of an alternative high voltage tolerant thin film transistor.
Figure 8B:
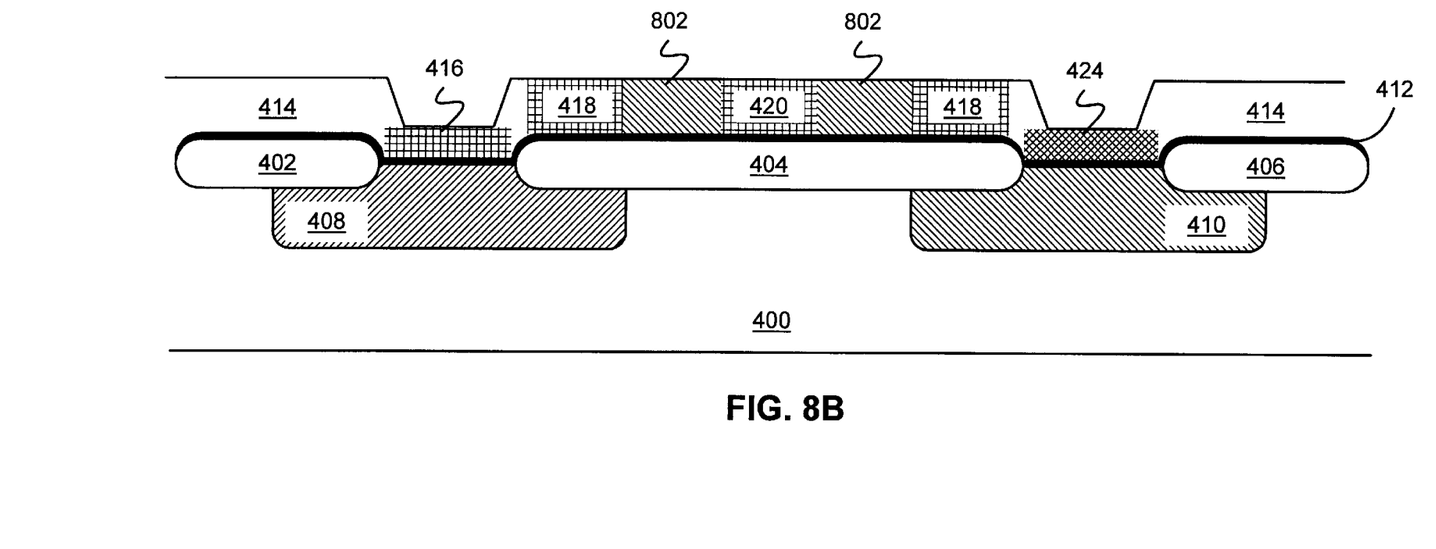

In an alternative embodiment, see FIGS. 8A and 8B, an additional implant operation is performed to lightly dope the polysilicon laid down during process step 308 (e.g., capacitor bottom plate polysilicon). Following the first polysilicon deposition (step 308), a p-type dopant such as Boron is used to lightly dope the polysilicon (step 800) before it is patterned and doped in step 310. This changes the TFT's channel region from neutral (undoped) to p− 802. Implantation step 800 is preferably a blanket implantation whose dosage is between approximately $e^{11}$ ions/cm$^2$ and $5 \times e^{12}$ ions/cm$^2$. Because this p-type dopant level is low, relative to n+ regions created during step 310, this step does not interfere with formation of TFT source 418 and drain 420, or with capacitor lower plate formation (all of which are typically n+). This additional step increases the TFT's drain breakdown voltage while simultaneously decreasing its drain leakage current ($I_D$).

A TFT fabricated in accordance with the first described embodiment provides a high gate voltage tolerant transistor that does not require any additional masking or process steps over those required to fabricate a conventional poly—poly capacitor. A TFT fabricated in accordance with the second described embodiment provides a transistor that exhibits both high gate and high drain voltage tolerance while requiring only one additional processing step—an inexpensive p− blanket implantation.

Various changes can be made in the foregoing illustrative embodiments without departing from the scope of the following claims. For example: low voltage (bulk) transistors do not have to be fabricated using high energy implant twin-well technology; isolation (step 302) and well formation (step 304) steps may be performed in reverse order—step 304 followed by step 302; a standard p-buried layer for epi-replacement may be formed in substrate 400 before any other steps (i.e., before step 302); the polysilicon layer deposited in step 308 may be patterned before it is selectively doped (step 310) or before the second polysilicon layer is deposited (step 312); dielectric material may be deposited (step 314) immediately following the deposition of the first polysilicon layer (step 308); and p-well and n-well channel stop implants can be formed to allow finer control over low voltage transistor threshold voltage or, alternatively, the substrate's bulk dopant level may be adjusted prior to fabrication to fulfill the same goal.

What is claimed is:

1. A thin film transistor fabrication process comprising:
    forming a first layer of silicon over the surface of a substrate, the first layer of silicon having a first conductivity type;
    defining a capacitor bottom plate region, a thin film transistor source region, a thin film transistor drain region, and a thin film transistor channel region in the first silicon layer;
    modifying the conductivity type of the capacitor bottom plate region, the thin film transistor source region, and the thin film transistor drain region to a second conductivity type;
    forming a layer of dielectric over the capacitor bottom plate region and the thin film transistor channel region; and
    forming a second layer of silicon over the capacitor bottom plate region and the thin film transistor channel region, the second layer of silicon having a third conductivity type.

2. The process of claim 1, further comprising patterning the first layer of silicon.

3. The process of claim 2, wherein the patterning is performed before the step of defining a capacitor bottom plate region, a thin film transistor source region, a thin film transistor drain region, and a thin film transistor channel region in the first silicon layer.

4. The process of claim 2, wherein the patterning is performed before the step of forming a layer of dielectric over the capacitor bottom plate region and the thin film transistor channel region.

5. The process of claim 1, wherein the step of forming a layer of dielectric over the capacitor bottom plate region and the thin film transistor channel region is performed before the step of defining a capacitor bottom plate region, a thin film transistor source region, a thin film transistor drain region, and a thin film transistor channel region in the first silicon layer.

6. The process of claim 1, wherein the first layer and the second layer of silicon comprise polysilicon.

7. The process of claim 1, wherein the first conductivity type is substantially neutral.

8. The process of claim 1, wherein the second conductivity type is n-type.

9. The process of claim 1, wherein patterning the first silicon layer further comprises defining a plurality of low voltage transistor gate regions.

10. The process of claim 9, wherein modifying the conductivity type further comprises:
    modifying the conductivity type of a first low voltage transistor gate region to a n-type conductivity; and
    modifying the conductivity type of a second low voltage transistor gate region to a p-type conductivity.

11. The process of claim 1, wherein the third conductivity type is n-type.

12. The process of claim 11, wherein the n-type conductivity is achieved by in situ doping of the second layer of silicon.

13. The process of claim 1, wherein modifying the conductivity type comprises doping the first layer of silicon with n-type impurities.

14. The process of claim 13, wherein doping comprises ion implantation.

15. The process of claim 13, wherein doping comprises diffusion.

16. The process of claim 13, wherein the n-type impurities are phosphorous ions.

17. The process of claim 13, wherein the n-type impurities are arsenic ions.

18. The process of claim 1, wherein the layer of dielectric comprises material selected from the group consisting of silicon dioxide, oxide-nitride-oxide, tetraethyl orthosilicate, and silicon nitride.

19. The process of claim 1, wherein modifying the conductivity type further comprises modifying the conductivity type of the thin film transistor gate region to a fourth conductivity type.

20. The process of claim 19, wherein the fourth conductivity type is a p-type conductivity type.

21. The process of claim 20, wherein the p-type conductivity type is achieved by doping with a p-type impurity.

22. The process of claim 21, wherein doping is by ion implantation.

23. The process of claim 21, wherein the p-type impurity is boron.

24. A thin film transistor produced in accordance with a process comprising the steps of:

forming a first layer of silicon over the surface of a substrate, the first layer of silicon having a first conductivity type;

defining a capacitor bottom plate region, a thin film transistor source region, a thin film transistor drain region, and a thin film transistor channel region in the first silicon layer;

modifying the conductivity type of the capacitor bottom plate region, the thin film transistor source region, and the thin film transistor drain region to a second conductivity type;

forming a layer of dielectric over the capacitor bottom plate region and the thin film transistor channel region;

forming a second layer of silicon over the capacitor bottom plate region and the thin film transistor channel region, the second layer of silicon having a third conductivity type; and patterning the first layer of silicon.

25. The thin film transistor of claim 24, wherein the step of patterning the first layer of silicon is performed before the step of defining a capacitor bottom plate region, a thin film transistor source region, a thin film transistor drain region, and a thin film transistor channel region in the first silicon layer.

26. The thin film transistor of claim 24, wherein the step of patterning the first layer of silicon is performed before the step of forming a layer of dielectric over the capacitor bottom plate region and the thin film transistor channel region.

27. The thin film transistor of claim 24, wherein the step of forming a layer of dielectric over the capacitor bottom plate region and the thin film transistor channel region is performed before the step of defining a capacitor bottom plate region, a thin film transistor source region, a thin film transistor drain region, and a thin film transistor channel region in the first silicon layer.

28. The thin film transistor of claim 24, wherein the first layer and the second layer of silicon comprise polysilicon.

29. The thin film transistor of claim 24, wherein the first conductivity type is substantially neutral.

30. The thin film transistor of claim 24, wherein the second conductivity type is n-type.

31. The thin film transistor of claim 24, wherein the third conductivity type is n-type.

32. The thin film transistor of claim 31, wherein the n-type conductivity is achieved by in situ doping of the second layer of silicon.

33. The thin film transistor of claim 24, wherein modifying the conductivity type comprises doping the first layer of silicon with n-type impurities.

34. The thin film transistor of claim 33, wherein doping comprises ion implantation.

35. The thin film transistor of claim 33, wherein doping comprises diffusion.

36. The thin film transistor of claim 24, wherein the layer of dielectric comprises material selected from the group consisting of silicon dioxide, oxide-nitride-oxide, tetraethyl orthosilicate, and silicon nitride.

37. The thin film transistor of claim 24, wherein modifying the conductivity type further comprises modifying the conductivity type of the thin film transistor gate region to a fourth conductivity type.

38. The thin film transistor of claim 37, wherein the fourth conductivity type is a p-type conductivity type.

* * * * *